US009204529B2

United States Patent
Ye et al.

(10) Patent No.: US 9,204,529 B2
(45) Date of Patent: Dec. 1, 2015

(54) BONDING STRUCTURE

(71) Applicant: TPK Touch Solutions (Xiamen) Inc., Xiamen (CN)

(72) Inventors: Huilin Ye, Xiamen (CN); Jing Yu, Xiamen (CN); Hua Luo, Xiamen (CN); Zongke Chiu, Tainan (TW); Yau-Chen Jiang, Zhubei (TW); Jianbin Yan, Putian (CN); Defa Wu, Jinjiang (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 167 days.

(21) Appl. No.: 13/858,955

(22) Filed: Apr. 9, 2013

(65) Prior Publication Data
US 2013/0264103 A1 Oct. 10, 2013

(30) Foreign Application Priority Data

Apr. 10, 2012 (CN) .......................... 2012 1 0102936

(51) Int. Cl.
| H05K 1/11 | (2006.01) |
| H05K 1/02 | (2006.01) |
| H05K 3/38 | (2006.01) |
| H05K 3/36 | (2006.01) |
| H05K 3/32 | (2006.01) |
| H05K 3/28 | (2006.01) |

(52) U.S. Cl.
CPC ............ *H05K 1/0213* (2013.01); *H05K 1/0277* (2013.01); *H05K 3/361* (2013.01); *H05K 3/38* (2013.01); *H05K 3/28* (2013.01); *H05K 3/323* (2013.01); *H05K 2201/099* (2013.01); *H05K 2201/09172* (2013.01); *H05K 2201/09381* (2013.01); *H05K 2201/09445* (2013.01)

(58) Field of Classification Search
CPC ..... H05K 1/0213; H05K 3/38; H05K 1/0277; H05K 3/361; H05K 3/323; H05K 3/28; H05K 2201/09172; H05K 2201/09381; H05K 2201/09445; H05K 2201/099
USPC .................................. 174/254–256, 259, 261
See application file for complete search history.

(56) References Cited

U.S. PATENT DOCUMENTS

| 5,120,591 | A  | * | 6/1992 | Tomita .......................... 428/138 |
| 6,601,947 | B1 | * | 8/2003 | Sato et al. ....................... 347/68 |
| 7,023,095 | B2 | * | 4/2006 | Lee et al. ....................... 257/774 |

(Continued)

FOREIGN PATENT DOCUMENTS

| CN | 101013237 A | 5/2011 |
| CN | 201829656 U | 5/2011 |

*Primary Examiner* — Hoa C Nguyen
(74) *Attorney, Agent, or Firm* — Gokalp Bayramoglu

(57) ABSTRACT

The present disclosure discloses a bonding structure, wherein a plurality of first bonding pads is located on a first substrate. A second substrate is disposed to partially face first substrate. A plurality of second bonding pads is located on second substrate with one side, and partially overlapped with the first bonding pads with the other side to form a bonding region and a peripheral region located in the periphery of the bonding region. An anisotropic conductive film is disposed between first bonding pads and second bonding pads. The anisotropic conductive film includes a plurality of conductive particles. At least one groove structure is disposed in the periphery region. When the conductive particles of the anisotropic conductive film are moving during the bonding process, the groove structure can accommodate the conductive particles moved hereto. Accordingly, short circuit caused by accumulation of the conductive particles in the bonding process can be avoided.

10 Claims, 5 Drawing Sheets

(56) References Cited

U.S. PATENT DOCUMENTS

| | | | |
|---|---|---|---|
| 7,916,262 B2 * | 3/2011 | Liu et al. | 349/150 |
| 2004/0238910 A1 * | 12/2004 | Fujii et al. | 257/433 |
| 2007/0242207 A1 * | 10/2007 | Fujita | 349/149 |
| 2011/0315536 A1 * | 12/2011 | Chiou et al. | 200/600 |
| 2012/0098784 A1 * | 4/2012 | Kim | 345/174 |
| 2013/0038542 A1 * | 2/2013 | Kim | 345/173 |

* cited by examiner

-- Prior Art --

BONDING STRUCTURE

This application claims the benefit of Chinese application No. 201210102936.6, filed on Apr. 10, 2012.

BACKGROUND

1. Technical Field

The present disclosure relates to a bonding structure, and more particularly, relates to a bonding structure using an anisotropic conductive film.

2. Description Of the Related Art

In the rapidly changing information age, electronic products have become closely related to our life and work. As the electronic products are becoming thinner, smaller, lighter, and more precise, in order to solve problems relating to incapability of high-temperature tin-lead welding in circuits such as flexible printed circuit (FPC), integrated circuit (IC), liquid crystal display (LCD), touch panel, and like products' circuits or pin connections, an anisotropic conductive film (hereafter referred to as ACF) and a related circuit connection method thereof have been developed for solving all kinds of circuit connection problems of electronic products.

ACF referred in this text is meant to include the anisotropic conductive film which is made into a form of film and an anisotropic conductive adhesive (ACA) which is made into a form of adhesive. ACF is made by disposing a plurality of conductive particles inside a semi-solid resin or by mixing a plurality of conductive particles with a strong adhesive, wherein the ACF has a characteristic of vertically conducting and horizontally non-conducting. While bonding, the anisotropic conductive film can be laid between the components to be bonded. After heating and pressurizing, ACF connects the components to be bonded by effects of temperature and pressure, so as to make the bonded components have conductive effect in a vertical direction and no conductive effect in a horizontal direction.

FIG. 1 illustrates conventional bonding structure of two components by ACF. FIG. 1 is drawn with an assumption of every component being transparent so as to make it convenient for viewing. As shown in FIG. 1, a plurality of bonding pads 4 are disposed on a substrate 2, wherein each of the bonding pads 4 is connected with a conducting wire 6; a plurality of bonding pads 10 are disposed on a substrate 8, wherein each of the bonding pads 10 is connected with a conducting wire 12; and an ACF layer 14 is laminated between the bonding pads 4 and the bonding pads 10 to form a bonding region 16 and a peripheral region 18. The bonding region 16 is an overlapping bonding region of the bonding pads 4 and the bonding pads 10, and the peripheral region 18 is a region located in the periphery of the bonding region 16. As there exists a relatively smaller space between the left-and-right adjacent bonding pads, while bonding, a plurality of conductive particles is easily extruded into the peripheral region 18 by pressure effect such that short circuit occurs between the left-and-right adjacent bonding pads. For example, of bonding, the conductive particles 20 in the ACF layer 14 may be extruded or over flown (can generally refer to floating) into the peripheral region 18 to gather and locate between two adjacent left-and-right bonding pads 4 and/or two adjacent left-and-right bonding pads 10, easily leading to short circuit.

Consequently, a novel bonding structure is still required for avoiding the above short circuit problem.

SUMMARY

The present disclosure provides a bonding structure having at least one groove. structure located in a peripheral region around a bonding region. When ACF is extruded during the bonding process, conductive particles in the ACF can move into the groove structure so that moving space of the conductive particles is increased and accumulation of the conductive particles is reduced, thereby reducing short circuit problem caused by accumulation of the conductive particles.

According to an embodiment of the present disclosure, a bonding structure includes a first substrate, a plurality of first bonding pads, a second substrate, a plurality of second bonding, pads, an ACF layer, and at least one groove structure. The plurality of first bonding pads is located on the first substrate. The second substrate is disposed to partially face the first substrate. The plurality of second bonding pads is located, on the second substrate with one side, and partially overlapped with the first bonding pads with the other side to form as bonding region and a peripheral region located in the periphery of the bonding region. The ACF layer is located between the first bonding pads and the second bonding pads. The groove structure is located in the peripheral region.

In the bonding structure of the present disclosure, since the peripheral region has a groove structure, when the conductive particles in the ACF are extruded to float during the bonding process, the conductive particles can move into the groove structure such that moving space of the conductive particles is increased and accumulation of the conductive particles is reduced, thereby reducing short circuit problem caused by accumulation of the conductive particles in the bonding process. Consequently, manufacturing process can be improved, and production yield is increased.

DETAILED DESCRIPTION

FIG. 2~FIG. 9 illustrate several embodiments of the present disclosure. In order to facilitate viewing, except for FIG. 5 and FIG. 8, each drawing is drawn with an assumption of each component being transparent. However, those skilled in the art would know the relative position of each component after understanding the present disclosure, and would understand that each component is not drawn based on the actual dimension.

Figure 1:
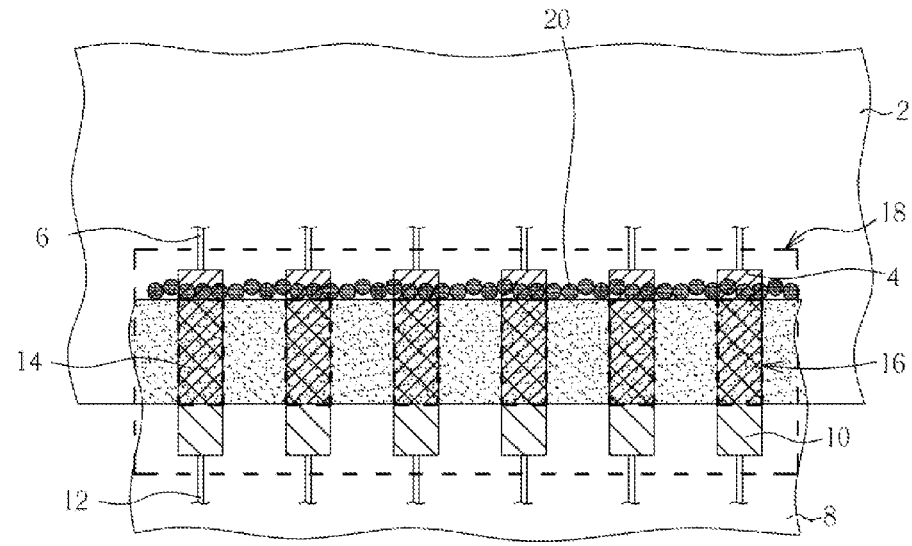
FIG. 1 illustrates a plan view of a conventional bonding structure.
Figure 2:
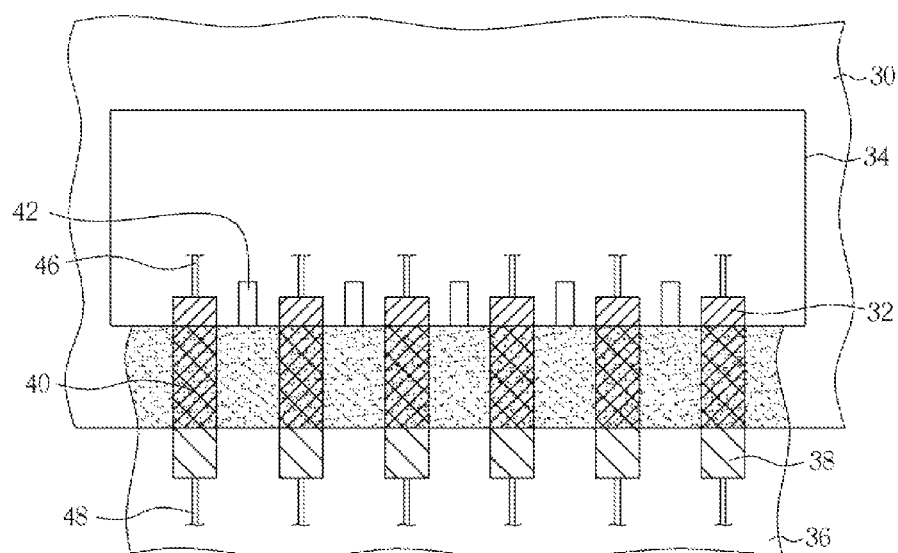
FIG. 2~FIG. 4 respectively illustrate plan views of a bonding structure in accordance with the first, second, and third embodiments of the present disclosure.

FIG. 2 illustrates a plan view of a bonding structure in accordance with a first embodiment of the present disclosure. In this bonding structure, a plurality of first bonding pads 32 is located on a first substrate 30, and a protective layer 34 partially covers the first bonding pads 32. A second substrate 36 is disposed to partially face the first substrate 30. In other words, the second substrate 36 is partially overlaid on the first substrate 30. A plurality of second bonding pads 38 is located on the second substrate 36 with one side, and partially overlapped with the first bonding pads 32 with the other side to form a bonding region and a peripheral region located in the periphery of the bonding region. The bonding region is an overlapping region of the first bonding pads 32 and the second bonding pads 38, and the peripheral region is a region located in the periphery of the bonding area. A schema of the bonding region and the peripheral region is shown in FIG. 1, and is not shown in FIG. 2 again. An ACF layer 40 is located between the first bonding pads 32 and the second bonding pads 38 to bond the first bonding pads 32 with the second bonding pads 38. The ACF layer 40 includes a plurality of conductive particles. The border of the protective layer 34 forms a groove between two adjacent first bonding pads 32 to obtain a plurality of first groove structures 42. The first groove structures 42 are located in the peripheral region and adjacent to the ACF layer 40 in the bonding region. When the conductive particles of the ACF layer 40 float or are extruded in the crimping, the first groove structures 42 can accommodate the conductive particles moved hereto.

The bonding structure further includes a plurality of first conducting wires 46. The first conducting wires 46 are respectively connected with the first bonding pads 32. When the bonding structure is applied to a touch panel, the other ends of the first conducting wires 46 can be connected with sensing units (not shown) on the touch panel. The protective layer 34 is used for covering and protecting the first conducting wires 46. The protective layer 34 can either be adjacent to the first bonding pads or can partially cover the first bonding pads 32. The first groove structure 42 located between two adjacent first bonding pads 32 can further extend to the position between two adjacent first conducting wires 46 which are connected with two adjacent first bonding pads 32.

The bonding structure further includes a plurality of second conducting wires 48. The second conducting wires 48 are respectively connected with the second bonding pads 38. Each drawing only illustrates a part of the first conducting wires 46 and the second conducting wires 48.

In this embodiment, the border of the protective layer 34 and the border of the second substrate 36 are adjacent to each other. Accordingly, surfaces of the first bonding pads 32 and the second bonding pads 38 are protected without exposure. However, the present disclosure is not limited to this embodiment. The second substrate 36 can partially cover the protective layer 34 and provide protection to the conducting wires or the bonding pads uncovered by the protective layer 34. Alternatively, the second substrate 36 and the protective layer 34 can also be adjacent without touching such that the bother of the protective layer 34 is adjacent to the first bonding pads 32.

The first groove structures 42 are obtained by forming concavities at the bother of the protective layer 34, wherein the concavities can be positioned and numbered so as make the protruding part of the protective layer 34 still cover the first bonding pads 32 so that the first bonding pads 32 are unlikely to be exposed from the side walls of the grooves.

Figure 3:
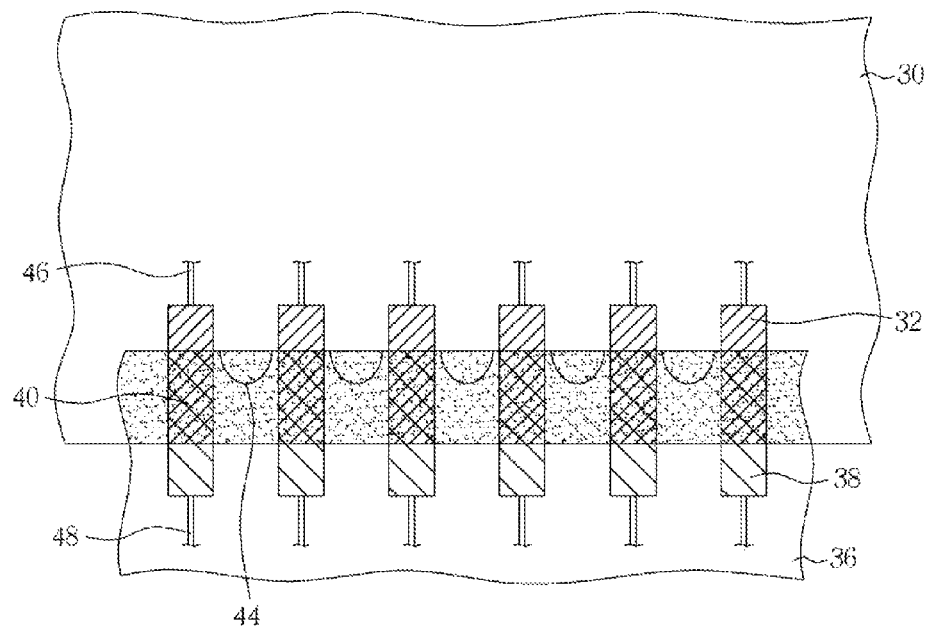

FIG. 3 illustrates a plan view of a bonding structure in accordance with a second embodiment of the present disclosure. The bonding structure in this embodiment is similar to the bonding structure in the foregoing embodiment, and the difference at least lies in that the groove structures are second groove structures 44 formed at the bother of the second substrate 36, wherein the border of the second substrate 36 forms concavities between two adjacent second bonding pads 38 as a plurality of second groove structures 44. The second groove structures 44 are namely located in the peripheral region for accommodating the conductive particles moved hereto in the crimping.

Figure 4:
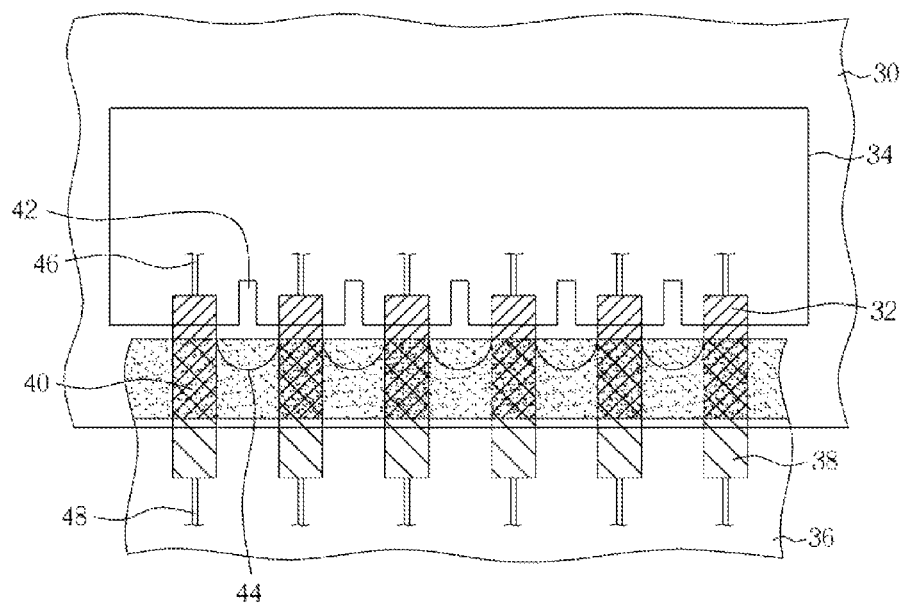
Figure 5:
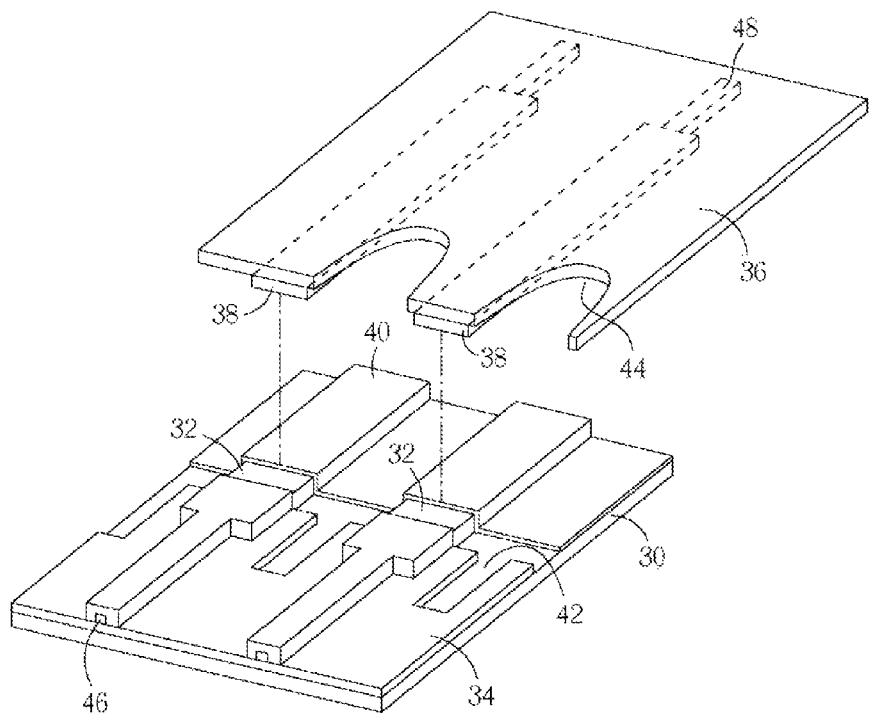
FIG. 5 illustrates an exploded view of a partially enlarged part of FIG. 4.

FIG. 4 illustrates a plan view of a bonding structure in accordance with a third embodiment of the present disclosure, and FIG. 5 illustrates an exploded view of a partially enlarged part of FIG. 4 for more clearly displaying the structure. With reference to FIG. 4 and FIG. 5 simultaneously, the bonding structure is similar to that of the first embodiment shown in FIG. 2, and the difference at least lies in that besides forming the first groove structures 42 shown in FIG. 2 at the border of the second substrate 36, the second groove structures 44 shown in FIG. 3 are also formed at the border of the second substrate 36. The first groove structures 42 and the second groove structures 44 are all located in the peripheral region and adjacent to the ACF layer 40, such that the conductive particles moved hereto can be accommodated, thereby increasing moving space of the conductive particles and reducing accumulation of the conductive particles.

According to one characteristic of the present disclosure, the bonding structure includes at least one groove structure. Consequently, in another embodiment, the bonding structure includes only one or a plurality of first groove structures 42, or includes only one or a plurality of second groove structures 44, or includes first groove structures 42 and second groove structures 44, which are all the situations of the present disclosure.

In the present disclosure shapes of the first groove structures 42 and the second groove structures 44 are not limited in any manner and can include rectangle (including square or a shape similar to rectangle), trapezium (including a shape similar to trapezium), arc (including U shape or a shape similar to arc), triangle (including V shape or a shape similar to triangle) or other incurvate shapes. If the groove structures formed at the border of the protective layer 34 or at the second substrate 36 are rectangular, shape of the protective layer 34 or the second substrate 36 would be similar to a great wall like shape. If the groove structures formed at the border of the protective layer 34 or at the second substrate 36 are arc-shaped, shape of the protective layer 34 or the second substrate 36 would be similar to a wavy shape. If the groove structures formed at the border of the protective layer 34 or at the second substrate 36 are triangular, shape of the protective layer 34 or the second substrate 36 would be similar to a saw-toothed shape. The protective layer 34 with such shapes can, not only protect the conducting wires and the bonding pads, but can also make room for the conductive particles to float such that distribution density of the conductive particles floating to the outside of the bonding pads gets smaller, and contact of the conductive particles is better avoided, thereby effectively reducing or even avoiding accumulation of the conductive particles, and finally reducing or even avoiding short circuit during the bonding process.

Figure 6:
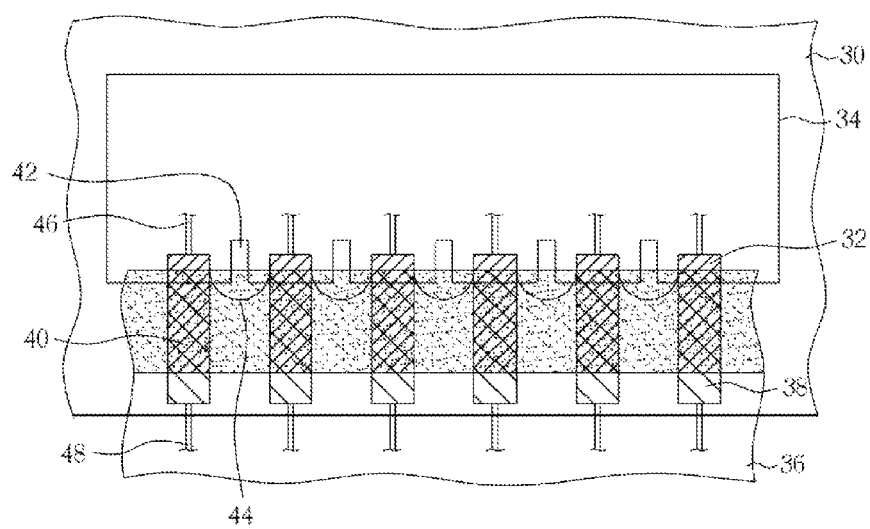
FIG. 6~FIG. 7 illustrate plan views of a bonding structure in accordance with the fourth and fifth embodiments of the present disclosure.

FIG. 6 illustrates a fourth embodiment of the present disclosure, which is similar to the third embodiment shown in FIG. 4. The difference at least lies in that the protective layer 34 and the second substrate 36 are partially overlapped. In other words, the border region of the second substrate 36 is overlaid on the border region of the protective layer 34. Accordingly, the second substrate 36 can protect the first conducting wires 46 or the first bonding pads 32 uncovered by the protective layer 34. The first groove structures 42 and the second groove structures 44 can be partially overlapped. FIG. 6 also illustrates that the border of the second bonding pads 38 is aligned with the border of the protective layer 34. Thus, if the border region of the second substrate 36 is overlaid on the border region of the protective layer 34, the border of the second bonding pads 38 is also overlaid on the border region of the protective layer 34.

According to another embodiment of the present disclosure, the border of the second bonding pads 38 can be not aligned with the border of the protective layer 34, namely, the second bonding pads 38 are indented in a length direction such that when the border region of the second substrate 36 is overlaid on the border region of the protective layer 34, the second bonding pads 38 are not overlapped with the protective layer 34.

Figure 7:
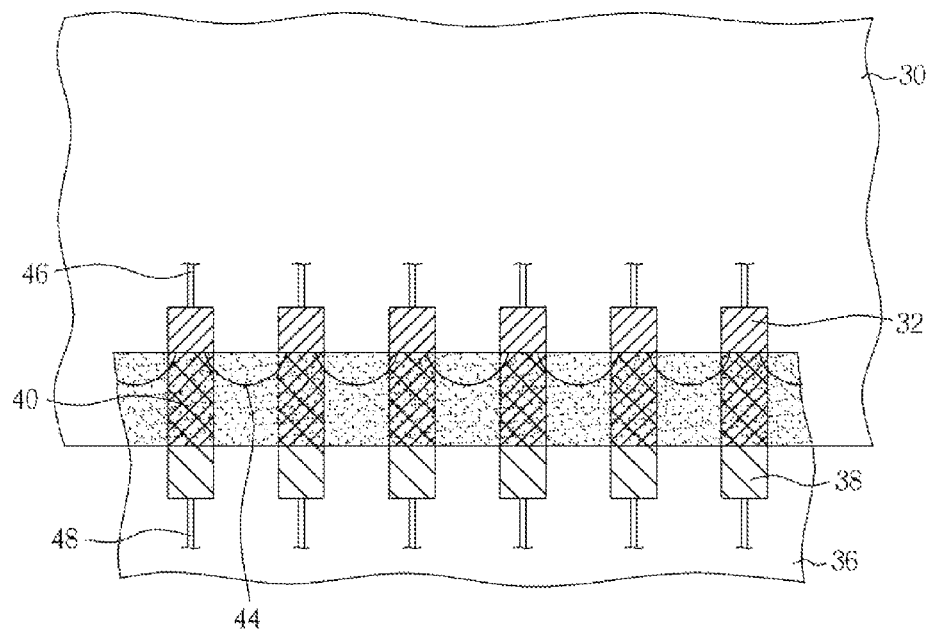

FIG. 7 illustrates a fifth embodiment of the present disclosure, which is similar to the bonding structure of the second embodiment shown in FIG. 3. The difference at least lies in that the front border of the second bonding pads 38 is narrowed from one or two sides. Accordingly, distance between the second bonding pads 38 is increased, and density of the conductive particles distributed between the second bonding pads 38 is less, such that probability of the conductive particles between the second bonding pads 38 being aligned into a line is reduced, which improves the problem of short circuit.

Figure 8:
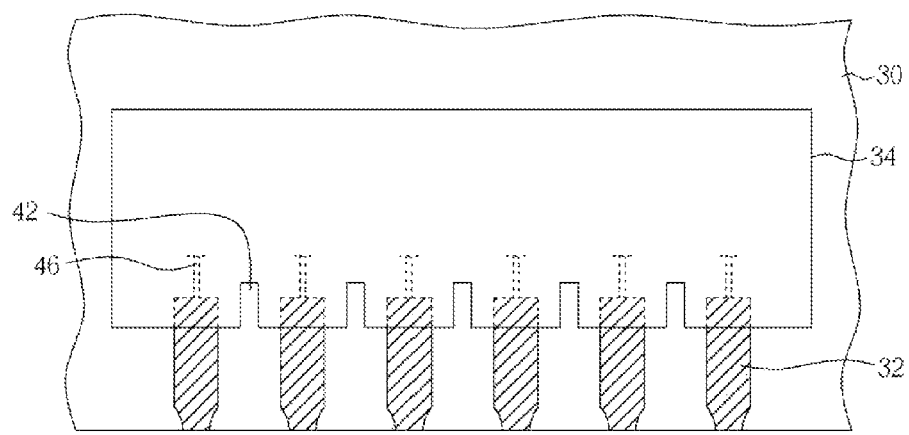
FIG. 8 illustrates a plan view of shape of first bonding pads in a bonding structure in accordance with the sixth embodiment of the present disclosure.

FIG. 8 illustrates the first bonding pads 32 in the bonding structure in accordance with a sixth embodiment of the present disclosure, which omits the ACF layer 40, the second bonding pads 38 the second substrate 36, and the second conducting wires 48. The bonding structure of the sixth embodiment is similar to the bonding structure of the first embodiment shown in FIG. 2, but the front border of the first bonding pads 32 is narrowed from one or two sides to increase distance between the adjacent first bonding pads 32, thereby further reducing probability of short circuit between the adjacent bonding pads.

It is to be noted that the structures that the front borders of the second bonding pads 38 and the first bonding pads 32 are narrowed from one or two sides as mentioned in the foregoing fifth embodiment (as shown in FIG. 7) and the sixth embodiment (as shown in FIG. 8) can be funned on the first bonding pads 32 and/or the second bonding pads 38 of other embodiments of the present disclosure, so as to increase distance between the adjacent first bonding pads 32 and/or the second bonding pads 38, thereby further reducing probability of short circuit between the adjacent bonding pads.

In an embodiment, bonding structure of the present disclosure can be applied to a connection of two components formed of ACF, wherein each of the two components has bonding pads, and wherein each of the two components is an electronic component. In particular, the disclosed bonding structure can be applied for bonding of a flexible printed circuit board (FPC) with a touch panel, for connection of a liquid crystal display panel with an IC Chip, or for connection of a flexible printed circuit board with a printed circuit board (PCB), and other like situations. It is to be noted that, the present disclosure can be applied to the design of a common touch panel.

Figure 9:
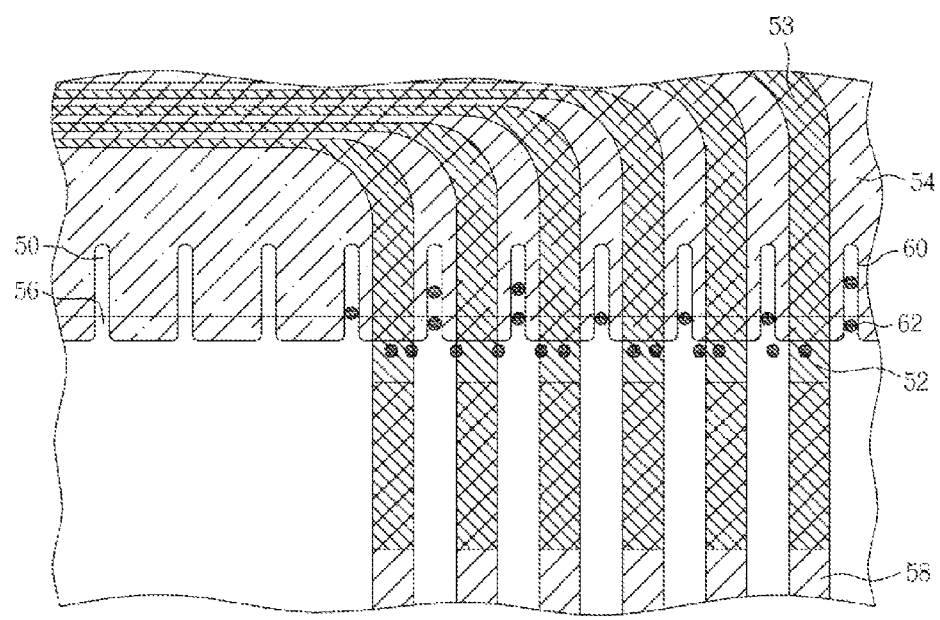
FIG. 9 illustrates a plan view of a situation of applying a bonding structure to a touch panel for bonding with a flexible circuit board in accordance with the seventh embodiment of the present disclosure.

In order to more clearly describe technical solutions of the present disclosure, the situation of bonding a touch panel with a flexible circuit board is illustrated below FIG. 9 illustrates a situation of applying a bonding structure to a touch panel for bonding with a flexible circuit board in accordance with the seventh embodiment of the present disclosure. In other to make it convenient for viewing. FIG. 9 is drawn with an assumption of each component being transparent, but those skilled in the art should know relative position of each component after understanding the present disclosure. In this embodiment, the bonding structure includes a substrate 50, a plurality of bonding pads 52, a protective layer 54 of a touch panel, a substrate 56, and a plurality of bonding pads 58 (such as connecting finger of FPC) of a flexible printed circuit, and an ACF layer (not shown) located between the bonding pads 52 and the bonding pads 58 for reclosing bonding and providing a vertical conduction. The protective layer 54 has a plurality of groove structures 60. Each of the groove structures 60 is located between two adjacent bonding pads 52. Each of the bonding pads 52 can be an extension of conducting wires 53 of the touch panel that connect the sensing units. The border region of the substrate 56 is partially overlapped with the protective layer 54 to locate on the border region of the protective layer 54, and the border of the bonding pads 58 is not overlapped with the protective layer 54. Conducting particles 62 in the conductive film flow to the border of the protective layer 54 and into the groove structures 60 to avoid short circuit caused by accumulation.

Each component of the present disclosure is described below in the form of embodiments, but the scope of the present disclosure is not limited hereto. In the present disclosure, material of the first substrate can be glass, polyethylene terephthalate (PET), polycarbonate (PC), polyethylene (PE), polymethyl methacrylate (PMMA) or the like. Material of the second substrate can be the material of the first substrate or material of FPC substrate such as polyimide, polyester film, or other polymer insulation materials. Material of the first bonding pads, the second bonding pads, and the conducting wires can respectively include metals such as copper and nickel copper alloy, non-metals such as transparent conductive film (indium tin oxide, short for ITO), or other applicable conductive materials. Width of the first bonding pads and the second bonding pads is normally 0.05 mm~0.1 mm. Distance between of the first bonding pads and distance between the second bonding pads can be mostly same as width of the bonding pads. Width of the first bonding pads and the second bonding pads is normally designed according to diameter of the conductive particles of ACF. For different ACF, diameter of the conductive particles may also be different. Width of the bonding pads is normally 10 times or above diameter of the conductive particles. Material of the protective layer can be photo resist, silicon dioxide, or other insulation materials. ACF is a vertical electric conductor. The groove structures located in the border of the protective layer can be formed by printing, exposing, developing or sputtering, horizontal width of which is at least greater than diameter of the conductive particles for being capable of accommodating the conductive particles moved hereto. The groove structures located in the border of the second substrate can be formed by die-cutting or cutting, horizontal width of which is at least greater than diameter of the conductive particles for being capable of accommodating the conductive particles moved hereto.

The foregoing descriptions are the preferred embodiments of the present disclosure only. All modifications and substitutions to the claims of the present disclosure are defined by the attached claims.

What is claimed is:

1. A bonding structure, comprising:
   a first substrate;
   a plurality of first bonding pads located on the first substrate;
   a second substrate disposed to partially face the first substrate;
   a plurality of second bonding pads located on the second substrate with one side; and the second bonding pads partially overlapped with the first bonding pads with the other side to form a bonding region; and a peripheral region located in the periphery of the bonding region;
   an anisotropic conductive film located between the first bonding pads and the second bonding pads; a plurality of first conducting wires respectively connected to the first bonding pads; and a protective layer overlaid on the first conducting wires; and at least a first groove structure located in the peripheral region and at least a second groove structure in the bonding region; wherein the first groove structure is obtained by forming a plurality of grooves in the border of the protective layer; and the first groove structure is located in the peripheral region and adjacent to the anisotropic conductive film in the bonding region; and wherein the second groove structure is obtained by forming a plurality of grooves in the border of the second substrate and located between two adjacent second bonding pads.

2. The bonding structure of claim 1, wherein the anisotropic conductive film includes a plurality of conductive particles, and wherein the first groove structure and the second groove structure are used for accommodating the conductive particles moved hereto.

3. The bonding structure of claim 1, wherein the border of the protective layer is adjacent to the first bonding pads or partially overlaid on the first bonding pads.

4. The bonding structure of claim 1, wherein the second substrate is partially overlaid on the border of the protective layer.

5. The bonding structure of claim 1, wherein shapes of the first groove structure and the second groove structure comprise one or more of rectangle, square, trapezium, arc, triangle, V shape, and other incurvate shapes.

6. The bonding structure of claim 1, wherein the front border of the first bonding pads is narrowed from one or two sides to increase a distance between the adjacent first bonding pads.

7. The bonding structure of claim 1, wherein the front border of the second bonding pads is narrowed from one or two sides to increase a distance between the adjacent second bonding pads.

8. The bonding structure of claim 1, wherein the second substrate and the second bonding pads are respectively a flexible board and connecting finger of a flexible printed circuit board.

9. The bonding structure of claim 1, further comprising a plurality of second conducting wires respectively connected to the second bonding pads.

10. The banding structure of claim 1, wherein the first substrate is a substrate of a touch panel, and wherein one end of the first conducting wire is connected with a sensing unit on the touch panel, and the other end is connected with the first bonding pad.

* * * * *